United States Patent
Ito et al.

(10) Patent No.: US 6,657,830 B2
(45) Date of Patent: Dec. 2, 2003

(54) MAGNETORESISTIVE MAGNETIC SENSOR WITH TUNNEL EFFECT AND MAGNETIC STORAGE APPARATUS

(75) Inventors: Kenchi Ito, Kokubunji (JP); Jun Hayakawa, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 183 days.

(21) Appl. No.: 09/911,541

(22) Filed: Jul. 25, 2001

(65) Prior Publication Data

US 2002/0097535 A1 Jul. 25, 2002

(30) Foreign Application Priority Data

Jan. 23, 2001  (JP) ........................................ 2001-013958

(51) Int. Cl.[7] ................................................ G11B 5/39
(52) U.S. Cl. .................................... 360/324.2; 324/252
(58) Field of Search ............................. 360/324.2, 324, 360/324.1; 324/252, 207.21; 338/32 R, 32 H

(56) References Cited

U.S. PATENT DOCUMENTS

| | | | | |
|---|---|---|---|---|
| 5,777,542 A | * | 7/1998 | Ohsawa et al. | 338/32 R |
| 5,896,252 A | * | 4/1999 | Kanai | 360/324.12 |
| 5,976,713 A | * | 11/1999 | Fuke et al. | 428/692 |
| 6,088,195 A | * | 7/2000 | Kamiguchi et al. | 360/324.12 |
| 6,114,850 A | * | 9/2000 | Hayashi | 324/252 |
| 6,205,008 B1 | * | 3/2001 | Gijs et al. | 360/324 |
| 6,365,286 B1 | * | 4/2002 | Inomata et al. | 428/692 |
| 6,387,549 B1 | * | 5/2002 | Obata et al. | 428/692 |
| 6,519,123 B1 | * | 2/2003 | Sugawara et al. | 360/324.2 |

OTHER PUBLICATIONS

Mikio Matsuzaki et al, "HDD Recording Density! Dramatically Improved TMR Head, Realized in 2002", pp. 177–184.

J.M. de Teresa, A. Barthelemy, A. Fert, J.P. Contour, R. Layonnet, F. Montaigne, P. Seneor and A. Vaures, Inverse Tunnel Magnetoresistance in $Co/SrTiO_3/La_{0.7}Sr_{0.3}MnO_3$: New Ideas on Spin–Polarized Tunneling, 1999 The American Physical Society, vol. 82, No. 21 (May 24, 1999), pp. 4288–4291.

Manish Sharma, Shan X. Wang and Janice H. Nickel, "Inversion of Spin Polarization and Tunneling Magnetoresistance in Spin–Dependent Tunneling Junctions," 1999 The American Physical Society, vol. 82, No. 3 (Jan. 18, 1999), pp. 616–619.

* cited by examiner

*Primary Examiner*—Brian E. Miller

(57) ABSTRACT

A magnetoresistive head has a high low resistance and a high MR ratio at room temperature and a S/N ratio that does not decrease sharply upon application of a bias voltage. The magnetoresistive head includes a soft magnetic free layer, a non-magnetic insulating layer, and a ferromagnetic pinned layer. The ferromagnetic pinned layer may have a spin valve layer whose magnetization is fixed with respect to the magnetic field to be detected. The magnetization of the soft magnetic free layer is permitted to rotate in response to an external magnetic field, thereby changing the relative angle with the magnetization of the ferromagnetic pinned layer and producing a magnetoresistive effect whose absolute value has a peak at a temperature range of 0–60° C. with a bias voltage Vs (applied across the ferromagnetic pinned layer and the soft magnetic free layer) in ranges of +0.2 to +0.8 V and −0.8 to −0.2 V.

22 Claims, 11 Drawing Sheets

MAGNETORESISTIVE MAGNETIC SENSOR WITH TUNNEL EFFECT AND MAGNETIC STORAGE APPARATUS

PRIORITY TO FOREIGN APPLICATIONS

This application claims priority to Japanese Patent Application No. P2001-013958.

BACKGROUND OF THE INVENTION

1. Field of the Invention

The present invention relates to an information recording-reproducing apparatus and a magnetic recording-reproducing head to be mounted thereon, and, more specifically, the present invention relates to an information recording medium that retains information by means of inverted magnetic domains on a magnetic recording film formed on a substrate and an information reproducing apparatus designed to reproduce information by detecting leakage magnetic fluxes from the recording medium.

2. Description of the Background

In recent years, magnetic disk apparatuses have greatly increased in recording density, with the track size for recording bits becoming smaller and smaller. These smaller domains require the magnetic reproducing head to have a higher sensitivity than past devices. One such reproducing head is reported in "Nikkei Electronics" No. 774, Jul. 17, 2000, pp. 177–184. The device disclosed in this reference employs a tunnel magnetoresistive film as a next-generation super-sensitive magnetic sensor.

This first conventional example is characterized by a patterned laminate structure consisting of a lower magnetic shield layer, an electrode layer, a soft magnetic free layer, a non-magnetic insulating layer, a ferromagnetic pinned layer, an antiferromagnetic layer to fix the direction of magnetization of the ferromagnetic pinned layer, and an electrode layer. The laminate film has, at both ends thereof, a hard magnetic layer to stabilize the direction of magnetization of the non-magnetic free layer and also has an insulating film to insulate the upper and lower magnetic shields.

In the above-mentioned example, the soft magnetic free layer is formed from a CoFe alloy; the non-magnetic insulating film is formed from aluminum oxide; and the ferromagnetic pinned layer is formed from a CoFe alloy. The sensor film has a very low resistance and a very high MR ratio (calculated by dividing the maximum resistance change due to applied magnetic field by the initial resistance) at room temperature. For instance, a sensor film having a resistance per area of 33.5 $\Omega \cdot \mu m^2$ has an MR ratio of 31.6%. A sensor film having a resistance per area of 14.2 $\Omega \cdot \mu m^2$ has an MR ratio of 24.4%. A sensor film having a resistance per area of 5.6 $\Omega \cdot \mu m^2$ has an MR ratio of 12.3%.

A second known example of sensor film is disclosed in Physical Review Letters, Vol. 82, No. 21, pp. 4288–4291. This sensor film employs a laminate film consisting of CoFe alloy, $SrTiO_3$, and $La_{0.7}Sr_{0.3}MnO_3$. It gives a high MR ratio (50% maximum) with a bias voltage (Vs) of –0.4 V at 4.2K.

A third known example of sensor film is disclosed in Physical Review Letters, Vol. 82, No. 3, pp. 616–619. This sensor film employs a laminate film consisting of $Ni_{0.8}Fe_{0.2}$, $Ta_2O_5$, $Al_2O_3$, and $Ni_{0.8}Fe_{0.2}$. It gives an MR ratio of 4% with a bias voltage (Vs) of –0.2 V at room temperature.

The above-mentioned known examples may be characterized by one or more of the following disadvantages. First, with respect to a sensor film having a low resistance and a high MR ratio at room temperature, such a tunnel magnetoresistive sensor in the form of CoFe/Al oxide/CoFe laminate film may include an MR ratio which steeply decreases (as shown in FIG. 11) when a bias voltage is applied across the two CoFe layers. A bias voltage (Vh) of approximately 0.4 V may decrease the MR ratio by up to half from that without bias voltage. When applied to a magnetic read head, this sensor film may have a decreased output in proportion to the bias voltage, unlike the known giant magnetoresistive magnetic read in practical use. Additionally, the tunnel magnetoresistive head, unlike the conventional giant magnetoresistive magnetic read head, may have a decreased signal-to-noise ratio because of its inherent shot noise proportional to the bias voltage.

In order to address one or more of these potential problems and to realize a practical tunnel magnetoresistive head suitable for magnetic recording-reproducing apparatuses with very high recording density, it is preferred to reduce the head resistance. Toward this end, it may be preferable to reduce the thickness of the aluminum oxide film used as the non-magnetic insulating film.

The second known example preferably only needs to meet less stringent requirements for head resistance than the conventional head of the first known example because the MR ratio, which is measured at 5K, reaches the maximum in the vicinity of the head-operating voltage (Vs=–0.5 V). However, a problem may ensure because $La_{0.7}Sr_{0.3}MnO_3$ is a substance which undergoes phase transition from ferromagnetic material to paramagnetic material in the neighborhood of room temperature. In other words, its MR ratio becomes almost zero at 0–60° C. (which is the operating temperature of the magnetic recording apparatus).

In the case of the third known example, the MR ratio reaches a maximum in the vicinity of the head-operating voltage (Vs=–0.2 V). This MR ratio, however, is smaller than that of the giant magnetoresistive head in practical use at the present. Therefore, the third known example may not be suitable for future magnetic recording-reproducing apparatuses with very high recording densities.

SUMMARY OF THE INVENTION

At least one embodiment of the present invention is directed to a magnetic sensor which preferably comprises a soft magnetic layer and a ferromagnetic layer, with a non-magnetic layer interposed between them such that the magnetization of said ferromagnetic layer is fixed with respect to the magnetic field to be detected. The invention may also include a magnetoresistive film that changes in magnetoresistance accordingly as the magnetization of the soft magnetic layer rotates in response to the external magnetic field, thereby changing the relative angle with the magnetization of the ferromagnetic layer. The magnetoresistive film may show a change in magnetoresistance upon the application of a detecting current across the soft magnetic layer and the ferromagnetic layer through the non-magnetic layer, with the ratio of change (in absolute value) in magnetoresistance of the magnetoresistive film having a maximum value greater than 20% at a temperature in the range from 0° C. to 60° C. and with a bias voltage (Vs) applied across the ferromagnetic layer and the soft magnetic layer being in the range from +0.2 to +0.8 V and from –0.8 to –0.2 V.

The present invention is also preferably directed to a magnetic sensor of tunnel junction laminate structure comprising a soft magnetic free layer, a non-magnetic insulating layer, and a ferromagnetic pinned layer, wherein the ferromagnetic pinned layer has a spin valve layer whose magnetization is fixed with respect to the magnetic field to be detected. The soft magnetic free layer may permit its magnetization to rotate in response to the external magnetic field, thereby changing the relative angle with the magnetization of the ferromagnetic pinned layer and producing the magnetoresistive effect, with the absolute value of the magnetoresistive effect having a peak at a temperature in the range from 0° C. to 60° C. and for a bias voltage Vs (applied across the ferromagnetic pinned layer and the soft magnetic free layer) in the range from +0.2 to +0.8 V and from −0.8 to −0.2 V.

In the tunnel magnetoresistive magnetic sensor, the ferromagnetic pinned layer may be formed from $Fe_3O_4$ or at least one oxide or compound of Cr and Mn. Additionally, in the tunnel magnetoresistive magnetic sensor, the nonmagnetic insulating layer may be formed from at least one oxide of Sr, Ti, and Ta. Moreover, in the tunnel magnetoresistive magnetic sensor, the soft magnetic free layer may be a layer of Co/Fe alloy formed on the nonmagnetic insulating layer or a laminate layer consisting of a layer of Co/Fe alloy and a layer of Ni/Fe alloy sequentially formed on the nonmagnetic insulating layer.

Alternatively, in the tunnel magnetoresistive magnetic sensor, the soft magnetic free layer may be a layer of Co/Fe alloy whose Co content is in the range from 70 atom % to 100 atom %, and the ferromagnetic pinned layer may be a layer of Co/Fe alloy whose Co content is in the range from 0% to 70%. Furthermore, the non-magnetic insulating layer may be formed from at least one oxide of Sr, Ti, and Ta.

In the tunnel magnetoresistive magnetic sensor, a layer of Ni/Fe alloy may also be laminated onto that side of the soft magnetic free layer of Co/Fe alloy which is opposite to the non-magnetic insulating layer. Alternatively, a second non-magnetic insulating layer and a second ferromagnetic layer may be sequentially laminated onto that side of the ferromagnetic pinned layer which is opposite to the non-magnetic insulating layer. The second ferromagnetic layer may be formed from $Fe_3O_4$ or at least one oxide or compound of Co, Cr, and Mn.

Further, in the tunnel magnetoresistive magnetic sensor, the non-magnetic insulating layer may be formed from at least one oxide or compound of Sr, Ti, Ta, and Al. The soft magnetic free layer may be a layer of Co/Fe alloy formed on the non-magnetic insulating layer or a laminate layer consisting of a layer of Co/Fe alloy and a layer of Ni/Fe alloy sequentially formed on the nonmagnetic insulating layer.

Additionally, the tunnel magnetoresistive magnetic sensor of the present invention preferably provides electrodes electrically connected respectively to the soft magnetic free layer, the ferromagnetic pinned layer, and the second ferromagnetic layer, so that current flows from the second ferromagnetic layer to the ferromagnetic pinned layer.

The present invention is also directed to a magnetic head which comprises any of the above magnetic sensors with a magnetic shield on its upper and lower parts and a metal layer placed between the magnetic sensor and the magnetic shield so as to electrically connect the magnetic sensor and the magnetic shield together.

The present invention is also directed to a recording-reproducing magnetic head which comprises the above magnetic head and an induction-type thin film magnetic head formed thereon. The induction-type thin film magnetic head preferably comprises: a lower magnetic core, an upper magnetic core, and a non-magnetic layer interposed between the lower and upper cores. The upper magnetic core may be connected at its forward end to the lower magnetic core with a magnetic gap interposed between them. The upper magnetic core may also be connected at its rear end directly to the lower magnetic core through a back-contact formed from a magnetic material.

The present invention is also directed to a magnetic recording-reproducing apparatus which preferably comprises a magnetic recording medium and said magnetic sensor or magnetic head, the former retaining information by means of inverted magnetic domains formed on the surface thereof.

BRIEF DESCRIPTION OF THE DRAWINGS

For the present invention to be clearly understood and readily practiced, the present invention will be described in conjunction with the following figures, wherein like reference characters designate the same or similar elements, which figures are incorporated into and constitute a part of the specification, wherein.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, other elements that may be well known. Those of ordinary skill in the art will recognize that other elements are desirable and/or required in order to implement the present invention. However, because such elements are well known in the art, and because they do not facilitate a better understanding of the present invention, a discussion of such elements is not provided herein. The detailed description will be provided hereinbelow with reference to the attached drawings.

Figure 1A:
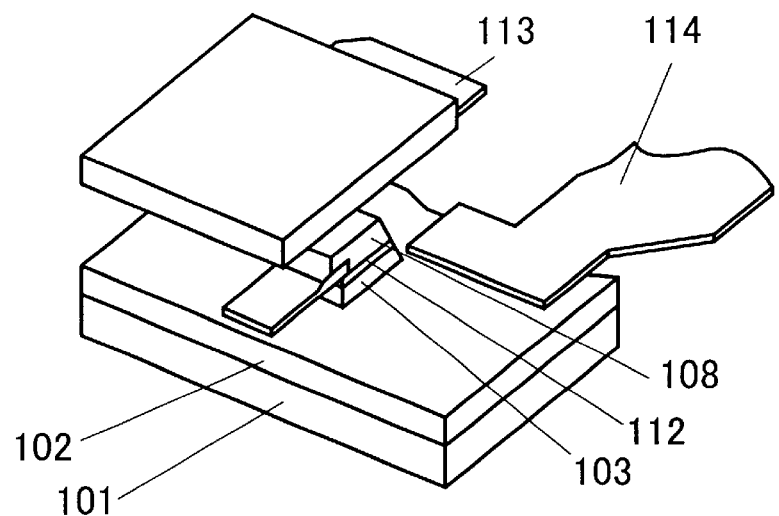
FIG. 1 is a perspective view (1A) and a sectional view (1B) showing a tunnel effect-type magnetic read head according to an embodiment of the present invention.
Figure 1B:
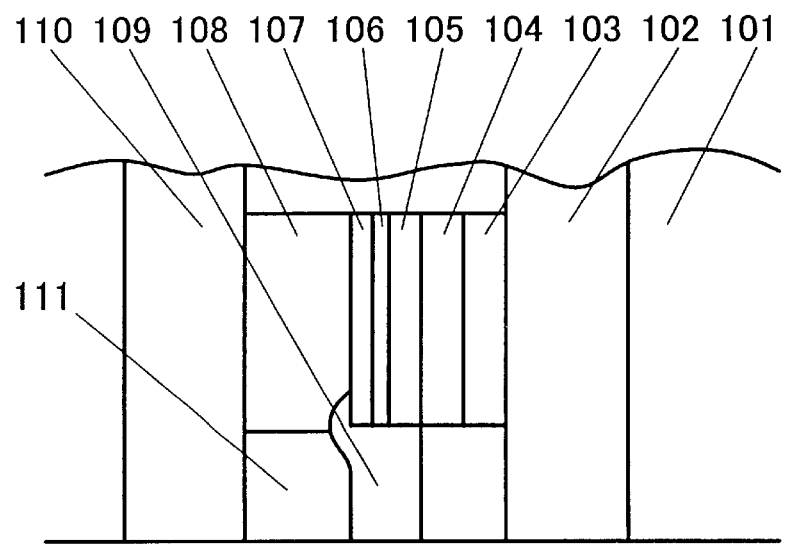

FIG. 1 shows a tunnel effect-type magnetic sensor and a magnetic read head provided therewith in one exemplary embodiment of the present invention. FIG. 1A is a perspective view showing the tunnel effect-type magnetic sensor and a magnetic read head provided therewith. FIG. 1B is a sectional view showing the tunnel effect-type magnetic sensor and a magnetic read head provided therewith.

There is shown a substrate 101. On the substrate 101 are preferably sequentially formed: a lower magnetic shield 102; a metal layer 103 of Cu, Ta, or Ru; an antiferromagnetic layer 104; a ferromagnetic pinned layer 105; a non-magnetic insulating layer 106; and a soft magnetic free layer 107 with its top being connected to an upper magnetic shield 110 through a metal layer 108 of Cu, Ta, or Ru. The magnetic sensor, which comprises the soft magnetic free layer 107, the non-magnetic insulating layer 106, and the ferromagnetic pinned layer 105, has a front side which is connected to a flux guide 109 of soft magnetic material so that the leakage flux from the magnetic recording medium (not shown) is efficiently introduced into the magnetic sensor 112.

In addition, the tunnel effect-type magnetic head is constructed such that the laminate film consisting of layers 103 through 108 is surrounded by an insulating layer 111 for electrical insulation because current has to flow from the lower magnetic shield 102 to the upper magnetic shield 110 only through the magnetic sensor 112. The lower magnetic shield 102 and the upper magnetic shield 110 are connected respectively to electrodes 114 and 113 for voltage application.

The ferromagnetic pinned layer 105 and the soft magnetic free layer 107 are magnetized (in the absence of a magnetic field from the magnetic recording medium) such that their directions of magnetization (within their plane) mutually cross at approximately right angles. When a magnetic field (H) is applied from the magnetic recording medium to the soft magnetic free layer 107 through the flux guide 109, the direction of magnetization within the plane of the soft magnetic free layer 107 rotates and the tunnel magnetic resistance between the soft magnetic free layer 107 and the ferromagnetic pinned layer 105 changes in proportion to the angle of rotation.

A detailed description will now be made of exemplary material and dimensions of each layer. The antiferromagnetic layer 104 is composed of ZnO (10 nm thick) for orientation control, NiO (20 nm thick), and α-$F_2O_3$ (2 nm thick), which are sequentially laminated. The ferromagnetic pinned layer 105 is formed from $Fe_3O_4$ (10 nm thick) which is a half-metal magnetic material having a Curie temperature much higher than room temperature. The non-magnetic insulating layer 100 is formed from $SrTiO_3$ (1 nm thick).

The magnetic free layer 107 is a laminate composed of layers of CoFe (1 nm thick) and NiFe (3 nm thick). The CoFe alloy is not specifically restricted in composition; in this embodiment it is composed of Co (90 atom %) and Fe (10 atom %) for appropriate soft magnetic properties. Likewise, the NiFe alloy is not specifically restricted in composition; in this embodiment it is composed of Ni (81 atom %) and Fe (19 atom %). This composition is called permalloy composition.

The metal layers 103 and 108 are preferably 3 nm thick and 10 nm thick, respectively, so that the soft magnetic free layer 107 is positioned at the approximate midpoint between the lower magnetic shield 102 and the upper magnetic shield 110. Thus, the distance between the lower magnetic shield 102 and the upper magnetic shield 110 is approximately 60 nm, which provides a linear resolution sufficient for a magnetic recording apparatus for very high recording density (0.155 $GB/mm^2$ or 100 $GB/inch^2$)

The element comprised of the layers between the lower electrode 103 to the upper electrode 108 measures approximately 0.3 by 0.3 $\mu$m. The forward end of the flux guide 109 measures approximately 0.15 $\mu$m wide, 10 nm thick, and 50 nm long. Since the width of the forward end of the flux guide 109 determines the resolution (in the track direction) of the magnetic recording apparatus, the above-mentioned size is small enough for a magnetic recording apparatus for very high recording density (0.155 $GB/mm^2$ or 100 $GB/inch^2$)

Figure 2A:
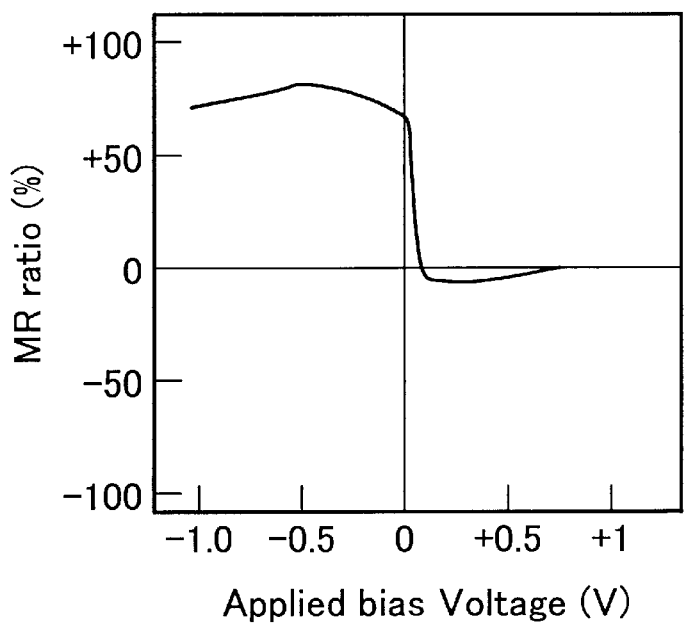
FIG. 2 shows a diagram of the dependence on bias voltage of the MR ratio of a tunnel effect-type magnetic read head according to an embodiment of the present invention (2A) and a diagram defining the direction of application of bias voltage (2B)
Figure 2B:
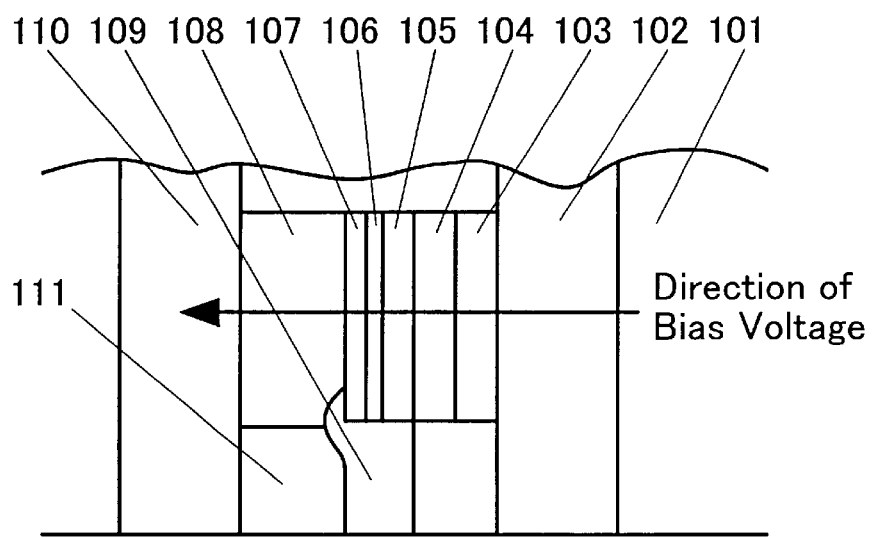

FIG. 2A shows how the MR ratio of the tunnel effect-type magnetoresistive head constructed as shown in FIG. 1 depends on the bias voltage (Vs) at room temperature (25° C.). The MR ratio is a ratio of the change in magnetic resistance which is defined as the maximum change in resistance due to an applied magnetic field divided by the initial resistance. FIG. 2B defines the direction in which the bias voltage is applied. In the present invention, the bias voltage is defined with reference to the ferromagnetic pinned layer where Vs=0 V.

It can be noted from FIG. 2A that the MR ratio reaches a maximum when Vs is −0.5 V and decreases rapidly as Vs approaches 0 V. The maximum value of the MR ratio is approximately 80%, and this value is greater than the maximum value ever conventionally observed. The dependence of MR ratio on bias voltage hardly varies in the temperature range from 0° C. to 60° C. at which the magnetic recording apparatus is used. When the applied magnetic field is zero, the electric resistance between the electrodes 113 and 114 is approximately 150 Ω, which is adequate for the magnetic read head.

Other materials which can be used for the ferromagnetic pinned layer include $CrO_2$ and $CuMnAl_2$. In the case where $CrO_2$ is used, the above-mentioned orientation-controlling film is preferably made of $TiO_2$ and the antiferromagnetic film is preferably made of NiO. In the case where $CuMnAl_2$ is used, the orientation-controlling film is not necessary. In this case, the lower electrode layer 103 is preferably formed from Ta and the antiferromagnetic film is formed from PtMn alloy. Other materials for the non-magnetic insulating layer 106 include $Ta_2O_5$ and MgO.

An second exemplary embodiment of the present invention describes a case in which both the soft magnetic free layer 107 and the ferromagnetic pinned layer 105 are based on a CoFe alloy. In this case, the lower electrode layer 103 is preferably a 12-nm thick Ta film, and the antiferromagnetic layer 104 is a 12-nm thick PtMn film. The ferromagnetic pinned layer 105 is a 3-nm thick CoFe film (containing 50 atom % of Co). The nonmagnetic insulating layer 106 is a 1-nm thick $SrTiO_3$ film.

In this embodiment, the soft magnetic free layer 107 is preferably a laminate composed of a 1-nm thick CoFe film and a 3-nm thick NiFe film. The CoFe alloy is comprised of 90 atom % of Co and 10 atom % of Fe. The NiFe alloy is not specifically restricted in composition; in this embodiment it is composed of 81 atom % of Ni and 19 atom % of Fe. This composition is called the permalloy composition. The metal layer is made of Ru, and it is approximately 28 nm thick so that the soft magnetic free layer 107 is positioned at a mid-point between the lower magnetic shield 102 and the upper magnetic shield 110.

The element comprised of the layers between the lower electrode 103 to the upper electrode 108 measures approximately 0.3 by 0.3 μm, as in the first embodiment.

Figure 3A:
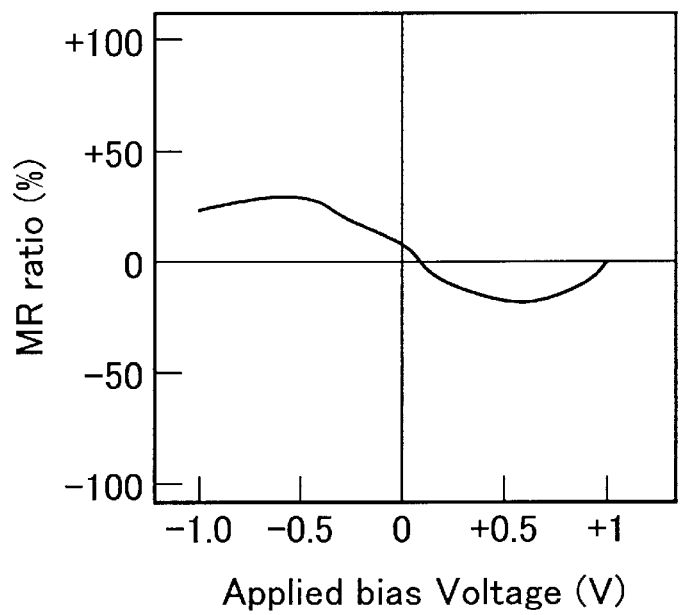
FIG. 3 is a diagram showing the dependence on bias voltage of the MR ratio of the tunnel effect-type magnetic read head according to an embodiment of the present invention.

FIG. 3A shows the dependence of the MR ratio of the tunnel effect-type magnetoresistive head in this embodiment on the bias voltage Vs at room temperature (25° C.). It can be noted from FIG. 3A that the MR ratio reaches a maximum when Vs is −0.5 V and decreases steeply as Vs approaches 0 V. The maximum value of the MR ratio is approximately 30%. The dependence of the MR ratio on the bias voltage does not substantially vary in the temperature range from 0° C. to 60° C. at which the magnetic recording apparatus is used. When the magnetic field applied is zero, the electric resistance between the electrodes 113 and 114 is approximately 100 Ω, which is adequate for the magnetic read head.

In the embodiment mentioned above, the CoFe alloy for the soft magnetic free layer 107 contains 90 atom % of Co, and the CoFe alloy for the ferromagnetic pinned layer 105 contains 50 atom % of Co. However, it may be desirable that the CoFe alloy for the soft magnetic free layer 107 contain 70–100 atom % of Co and the CoFe alloy for the ferromagnetic pinned layer 105 to contain 0–70 atom % of Co.

Figure 3B:
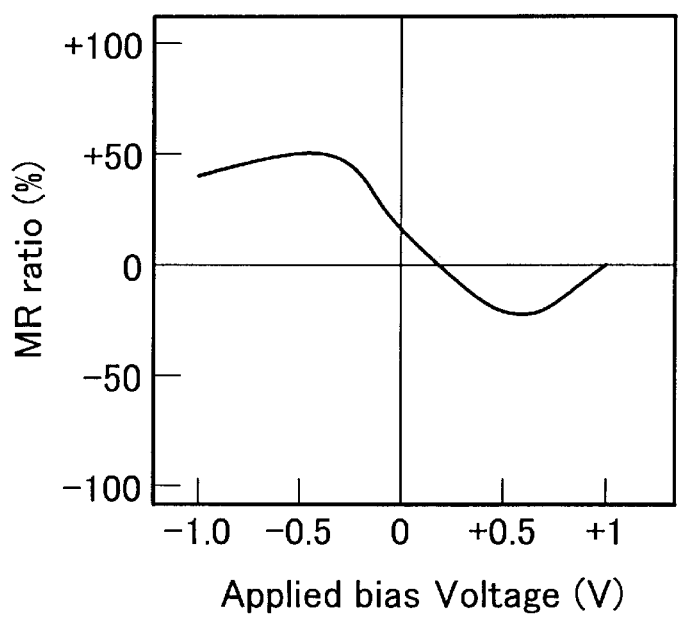

FIG. 3B shows the dependence of the MR ratio of the tunnel effect-type magnetoresistive head on the bias voltage Vs at room temperature (25° C.) in the case where the soft magnetic free layer 107 is made of a CoFe alloy containing 90 atom % of Co and the ferromagnetic pinned layer 105 is made of a CoFe alloy containing 30 atom % of Co. It can be noted from FIG. 3B that the MR ratio reaches a maximum when Vs is −0.3 V and decreases steeply as Vs approaches 0 V. The maximum value of the MR ratio is approximately 45%. The dependence of the MR ratio on the bias voltage does not substantially vary in the temperature range from 0° C. to 60° C. at which the magnetic recording apparatus is used. When the applied magnetic field is zero, the electric resistance between the electrodes 113 and 114 is approximately 70 Ω, which is adequate for the magnetic read head.

Other materials for the non-magnetic insulating layer 106 may include $Ta_2O_5$ and MgO as in the first embodiment.

Figure 4A:
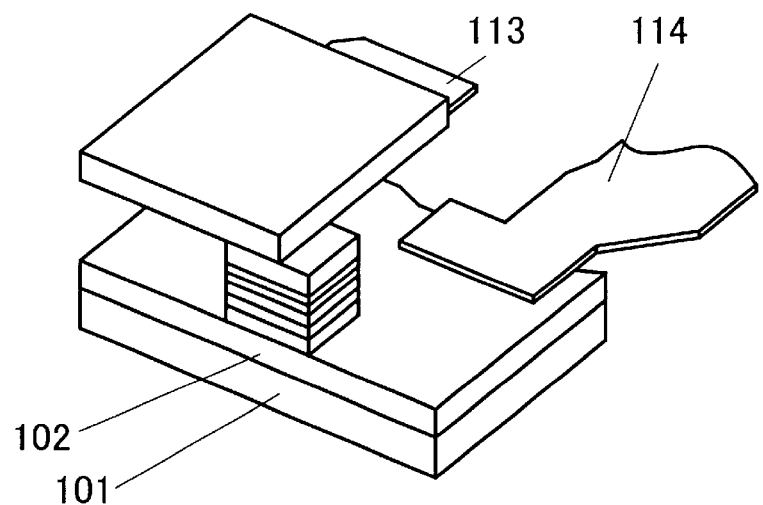
FIG. 4 is a perspective view (4A) and a sectional view (4B) showing a tunnel effect-type magnetic read head according to an embodiment of the present invention.
Figure 4B:
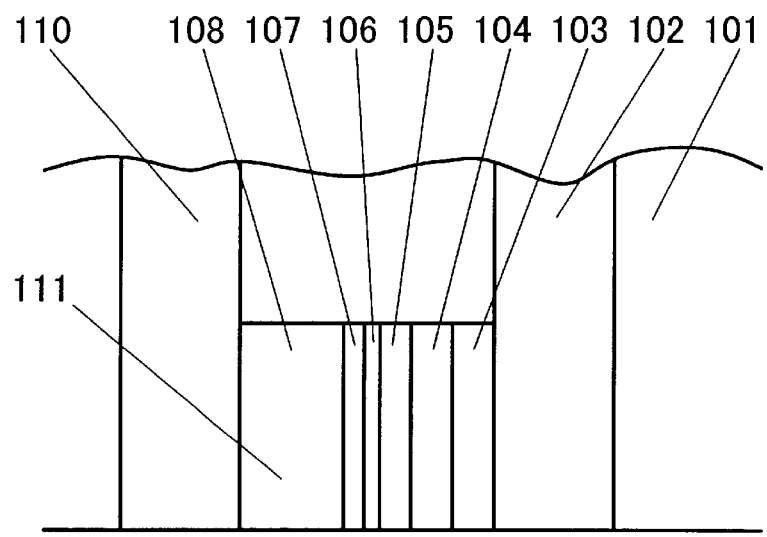

FIG. 4 shows a third exemplary embodiment of the present invention in which the tunnel effect-type magnetoresistive head shown in FIG. 1 is modified such that the element comprised of the layers between the lower electrode 103 and the upper electrode 108 is exposed toward that side of the head which faces the recording medium. In this case, the materials and dimensions of each layer are preferably identical with those in the first exemplary embodiment. However, the output of the magnetic read head increases because the magnetic flux does not attenuate in the flux guide.

Figure 5A:
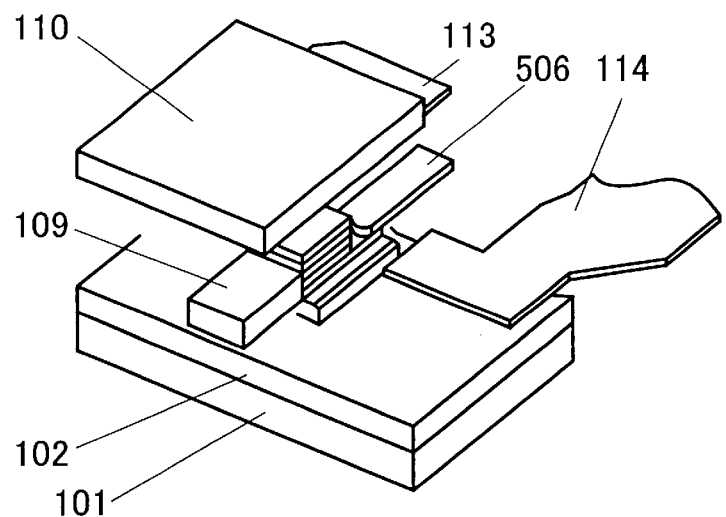
FIG. 5 is a perspective view (5A) and a sectional view (5B) showing the tunnel effect-type magnetic read head according to an embodiment of the present invention.
Figure 5B:
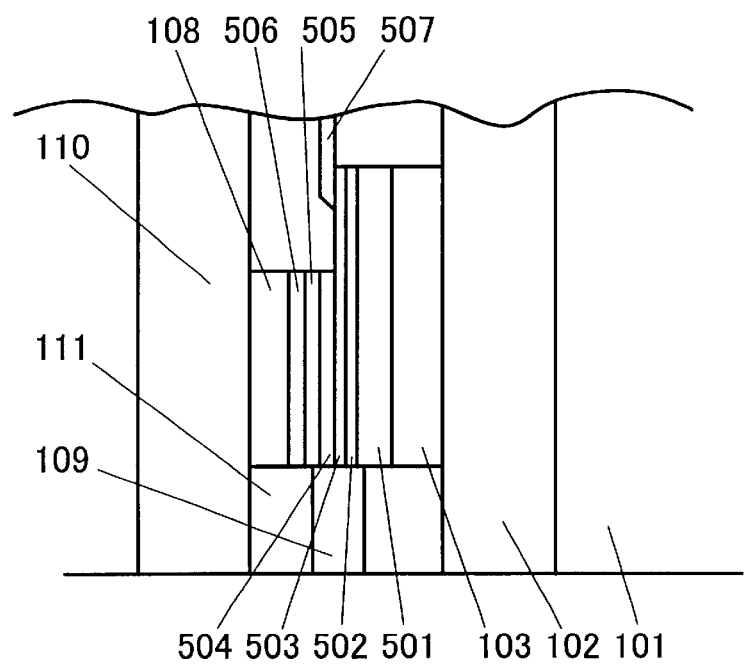

FIG. 5 shows a fourth exemplary embodiment of the present invention demonstrating the tunnel effect-type magnetic sensor according to the present invention and the magnetic read head provided therewith. FIG. 5A is a perspective view showing the tunnel effect-type magnetic sensor and the magnetic read head provided therewith. FIG. 5B is a sectional view showing the tunnel effect-type magnetic sensor and the magnetic read head provided therewith.

There is shown a substrate 101. On the substrate 101 are preferably sequentially formed: a lower magnetic shield 102; a metal layer 103 of Cu, Ta, or Ru; a ferromagnetic layer 501; a non-magnetic insulating layer 502; a soft magnetic free layer 503; a non-magnetic insulating layer 504; a ferromagnetic pinned layer 505; and an antiferromagnetic layer 506. The upper portion is connected to an upper magnetic shield 110, with a metal layer 108 of Cu, Ta, or Ru interposed between them. The magnetic sensor, which consists of the soft magnetic free layer 503, the non-magnetic insulating layer 504, and the ferromagnetic pinned layer 505, has a front side which is connected to a flux guide 109 of soft magnetic material so that the leakage flux from the magnetic recording medium (not shown) is efficiently introduced into the magnetic sensor 112.

Additionally, the tunnel effect-type magnetic head is preferably constructed such that the laminate film comprising layers 103 through 108 is surrounded by an insulating layer 111 for electrical insulation because current has to flow from the lower magnetic shield 102 to the upper magnetic shield 110 only through the magnetic sensor 112. The lower magnetic shield 102, the upper magnetic shield 110, and the soft magnetic free layer 503 are connected respectively to electrodes 114, 113, and 507 for voltage application.

The ferromagnetic pinned layer 105 and the soft magnetic free layer 107 are magnetized (in the absence of a magnetic field from the magnetic recording medium) such that their directions of magnetization (within their plane) mutually cross at approximately right angles. When a magnetic field (H) is applied from the magnetic recording medium to the soft magnetic free layer 107 through the flux guide 109, the direction of magnetization within the plane of the soft magnetic free layer 107 rotates, and the tunnel magnetic resistance between the soft magnetic free layer 503 and the ferromagnetic pinned layer 105 changes in proportion to the angle of rotation.

A detailed description will now be made of exemplary materials and dimensions for each layer. The antiferromagnetic layer 506 is composed of PtMn (12 nm thick). The ferromagnetic pinned layer 505 is formed from CoFe alloy (3 nm thick). The CoFe alloy is not specifically restricted in composition; it contains 90 atom % of Co. The non-magnetic insulating layer 504 is formed from $SrTiO_3$ (1 nm thick).

The soft magnetic free layer 503 is preferably a laminate comprised of layers of NiFe (3 nm thick) and CoFe (1 nm thick). The CoFe alloy is not specifically restricted in composition; in this embodiment, it is composed of Co (90 atom %) and Fe (10 atom %) for appropriate soft magnetic properties. Likewise, the NiFe alloy is not specifically restricted in composition; in this embodiment it is composed of Ni (81 atom %) and Fe (19 atom %) This composition is called permalloy composition.

The non-magnetic insulating layer 502 is formed from Al oxide (approximately 2 nm thick). The ferromagnetic layer 501, which is formed on the electrode metal layer 103, is composed of a 2-nm thick film of $\alpha\text{-}Fe_2O_3$ and a 10-nm thick film of $Fe_3O_4$ which is a half-metal magnetic material having a Curie temperature much higher than room temperature. The metal layers 103 and 108 are 14 nm thick and 12 nm thick, respectively, so that the soft magnetic free layer 503 is positioned at an approximately mid-point between the lower magnetic shield 102 and the upper magnetic shield 110. Thus the distance between the lower magnetic shield 102 and the upper magnetic shield 110 is approximately 60 nm, which provides a linear resolution sufficient for a magnetic recording apparatus for very high recording density (0.155 $GB/mm^2$ or 100 $GB/inch^2$).

The element composed of the layers between the lower electrode 103 and the upper electrode 108 measures 0.3 by 0.3 μm. The forward end of the flux guide 109 measures 0.15 μm wide, 10 nm thick, and 50 nm long. Since the width of the forward end of the flux guide 109 determines the resolution (in the track direction) of the magnetic recording apparatus, the above-mentioned size is small enough for a magnetic recording apparatus for very high recording density (0.155 GB/mm$^2$ or 100 GB/inch$^2$).

The operation of the device will now be detailed. In this embodiment, the current to detect the tunnel magnetoresistive effect is produced by the bias voltage Vs applied across the electrodes 507 and 113, with the electrode 507 being the reference. The electrode 114 is negatively biased with reference to the electrode 507, so that downwardly spin polarized tunnel electrons are injected into the soft magnetic free layer 503 from the half-metal ferromagnetic layer 501. Thus the density of the downward spin electrons increases in CoFe constituting the soft magnetic free layer 503, thereby enhancing the magnetoresistive effect.

Figure 6:
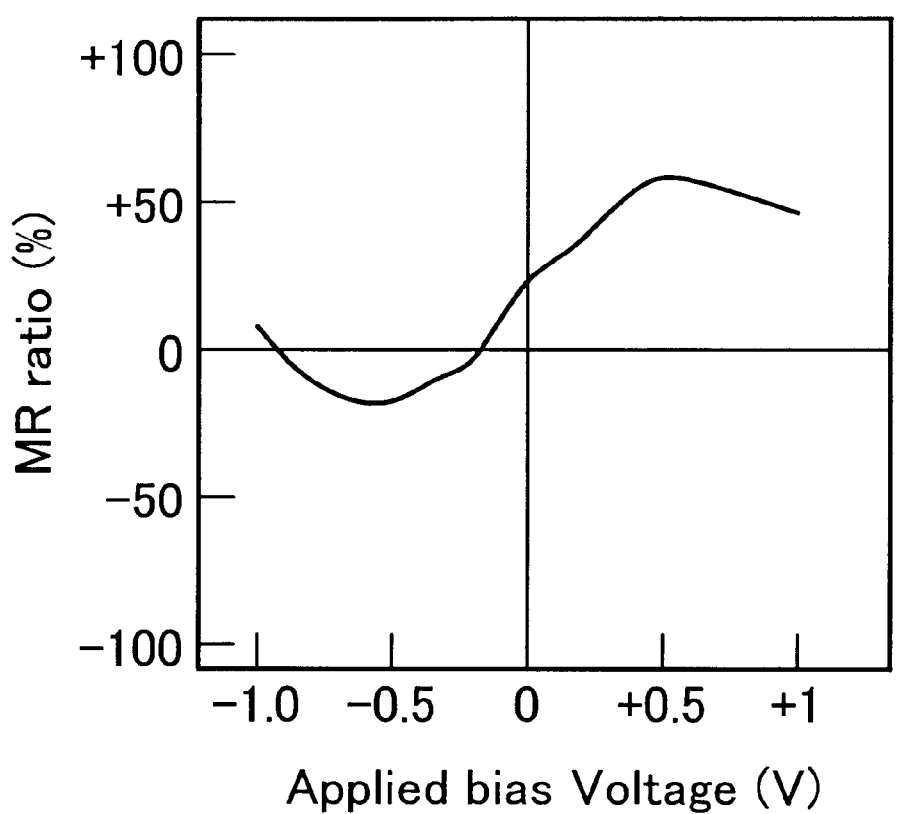
FIG. 6 is a diagram showing the dependence on bias voltage of the MR ratio of the tunnel effect-type magnetic read head according to an embodiment of the present invention.

FIG. 6 shows the dependence of the MR ratio of the tunnel effect-type magnetoresistive head (constructed as shown in FIG. 5) on the bias voltage Vs at room temperature (25° C.). It can be noted from FIG. 6 that the MR ratio reaches a maximum when Vs is +0.5 V and decreases steeply as Vs approaches 0 V. The maximum value of the MR ratio is approximately 60%. This value is greater than that in the second exemplary embodiment in which the CoFe alloy is used for both the soft magnetic free layer and the ferromagnetic pinned layer. The dependence of MR ratio on bias voltage does not substantially vary in the temperature range from 0° C. to 60° C. at which the magnetic recording apparatus is used. When the magnetic field applied is zero, the electric resistance between the electrodes 507 and 113 is approximately 70 Ω, which is adequate for the magnetic read head.

Other materials to be used for the ferromagnetic layer 501 may include $CrO_2$ and $CuMnAl_2$ as in the first exemplary embodiment. In the case where $CrO_2$ is used, the above-mentioned orientation-controlling film may be made of $TiO_2$, and the antiferromagnetic film is made of NiO. In the case where $CuMnAl_2$ is used, the orientation-controlling film is not necessary, and the lower electrode layer 103 is preferably formed from Ta and $CuMnAl_2$ immediately thereon. Other materials for the non-magnetic insulating layer 504 may include $Ta_2O_5$ and MgO. Other materials for the non-magnetic insulating layer 502 may include $SrTiO_3$, $Ta_2O_5$ and MgO.

The device depicted according to this embodiment has a flux guide 109; however, this structure may be modified such that the element composed of layers between the metal layer 103 to the metal layer 108 is exposed toward that side of the magnetic sensor which faces the recording medium.

Figure 7:
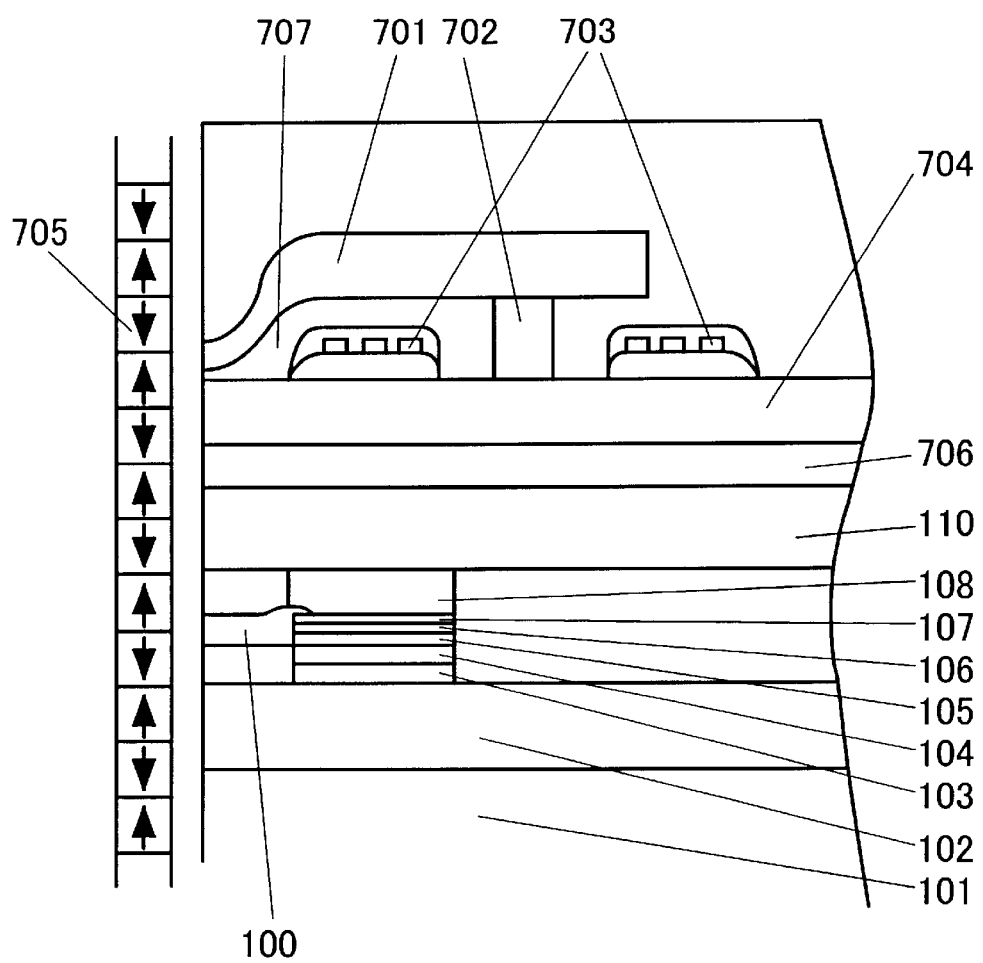
FIG. 7 is a sectional view showing a magnetic recording-reproducing head which consists of the tunnel effect-type magnetic read head of the present invention and an induction-type magnetic recording head.

FIG. 7 shows an example of a magnetic recording-reproducing head which is made up of the tunnel magnetoresistive magnetic read head (described in any of the above embodiments) and an induction-type magnetic recording head formed thereon. The device shown in FIG. 7 is an example in which the tunnel magnetoresistive magnetic read head shown in FIG. 1) is used. Similar magnetic recording-reproducing heads may be constructed simply by replacing the tunnel magnetoresistive magnetic read head from other embodiments.

In FIG. 7, there is shown a substrate 101. On the substrate 101 is formed the tunnel magnetoresistive magnetic read head shown in FIG. 1. On this read head are preferably sequentially formed a non-magnetic insulating layer 706, a lower magnetic core 704, and an upper magnetic core 701 which communicates with the lower magnetic core through a back contact 702. Around the back contact is formed a coil 703 which induces a magnetic flux in the magnetic core. The above-mentioned magnetic recording-reproducing head is installed in the proximity of the magnetic recording medium 705 to be magnetized in the direction of plane, for information recording and reproduction.

Figure 8:
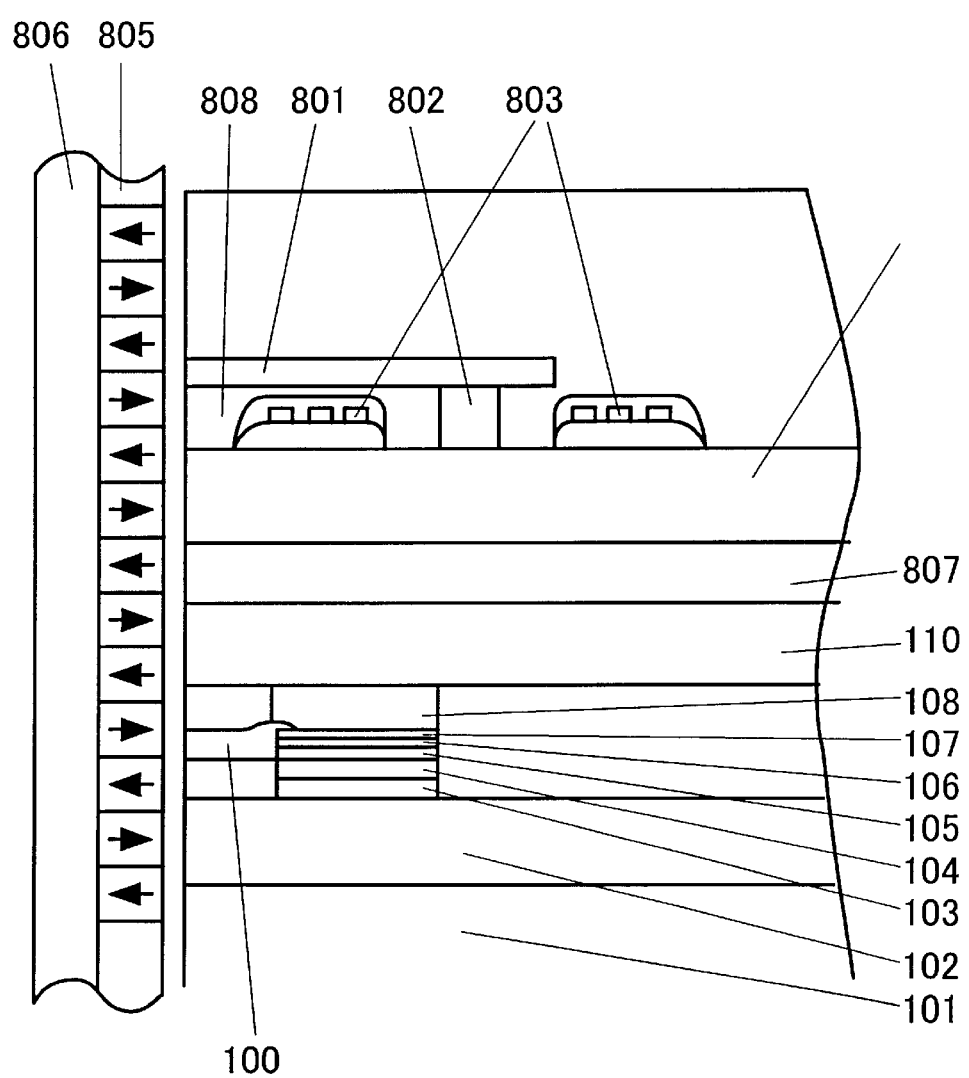
FIG. 8 is a sectional view showing a magnetic recording-reproducing head which consists of the tunnel effect-type magnetic read head of the present invention and a single-magnetic pole magnetic recording head.

FIG. 8 shows an example of a magnetic recording-reproducing head which is made up of the tunnel magnetoresistive magnetic read head described in any of the above embodiments and a vertical magnetic recording head of single-magnetic pole type formed thereon. The device shown in FIG. 8 is a particular example in which the tunnel magnetoresistive magnetic read head shown in FIG. 1 is used. Similar magnetic recording-reproducing heads may be constructed simply by replacing the tunnel magnetoresistive magnetic read head from other embodiments.

In FIG. 8, there is shown a substrate 101. On the substrate 101 is formed the tunnel magnetoresistive magnetic read head shown in FIG. 1. On this read head are preferably sequentially formed a non-magnetic insulating layer 807, a lower magnetic core 804, and an upper magnetic core 801 of single magnetic pole type which communicates with the lower magnetic core through a back contact 802. Around the back contact is formed a coil 903 which induces a magnetic flux in the magnetic core. The above-mentioned magnetic recording-reproducing head is installed in the proximity of the vertical magnetic recording medium for information recording and reproduction. This magnetic recording medium comprises a vertical magnetic recording layer 805 (to be magnetized in the vertical direction with respect to the plane of the recording medium) and a soft magnetic backing layer 806.

Figure 9:
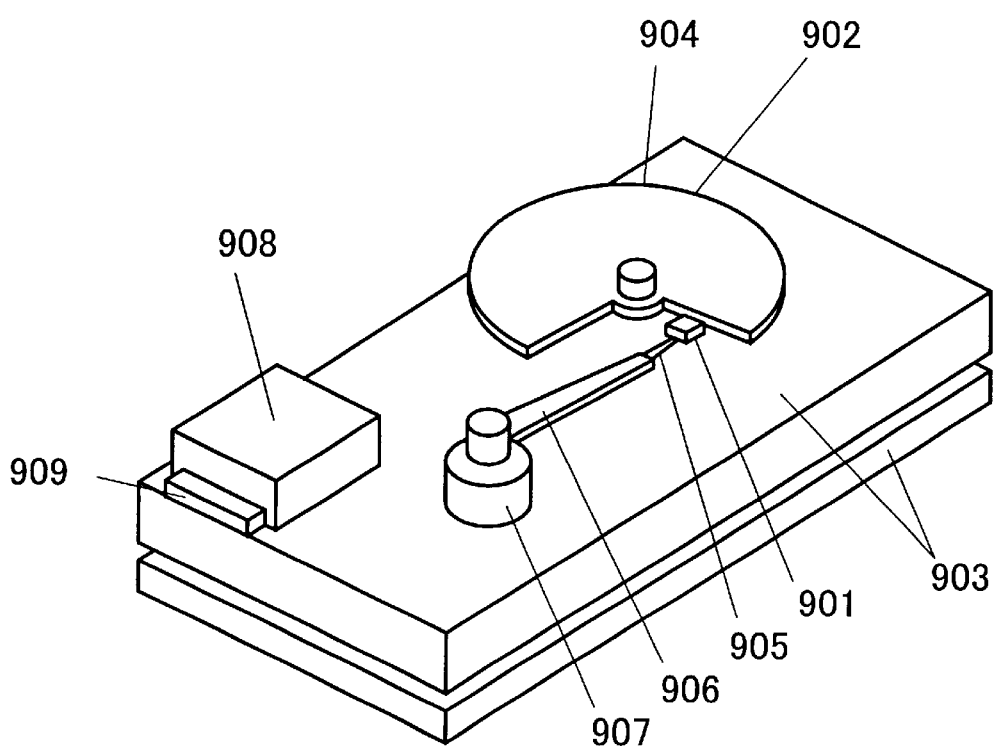
FIG. 9 is a diagram showing a magnetic recording-reproducing apparatus which is equipped with any of the magnetic read heads according to the present invention and the magnetic recording-reproducing head shown in FIG. 7 or FIG. 8.

FIG. 9 shows a magnetic recording-reproducing apparatus on which are mounted a slider 901 and a recording disc 902. The slider 901 is preferably provided with any one of the magnetic read heads described above and a magnetic recording head. The recording disc 902 is mounted on an axis 904 connected to a spindle motor (not shown) fixed to the base 903. The recording disc 902 is turned by the spindle, so that it moves relative to the slider 901. The slider 901 is fixed to the suspension 905, which in turn is attached to the arm 906. The arm 906 is turned around the axis 904 by the moving mechanism 907, so that the slider 901 is moved for tracking in the radial direction of the recording disc 902. The interface 908 attached to the base 903 has the connector 909, to which is connected a cable for power supply (to drive the apparatus) and information input and output (including commands to the apparatus and information to be recorded and information which has been read).

An exemplary version of the above-mentioned magnetic recording-reproducing apparatus provided with the tunnel magnetoresistive magnetic head having improved dependence on bias voltage was examined for output. The measured output was compared with that of the conventional tunnel magnetoresistive magnetic head. The results are shown in FIG. 10.

Figure 10:
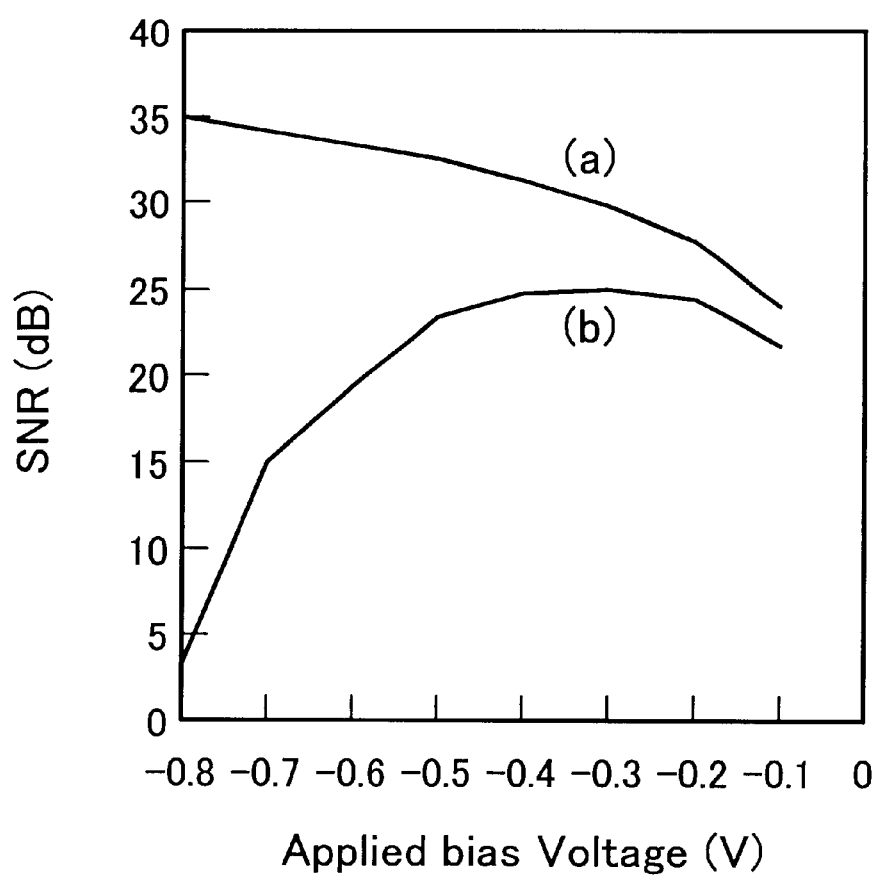
FIG. 10 is a diagram showing the relation between the bias voltage and the signal-to-noise ratio of a tunnel magnetoresistive read head according to the present invention.
Figure 11:
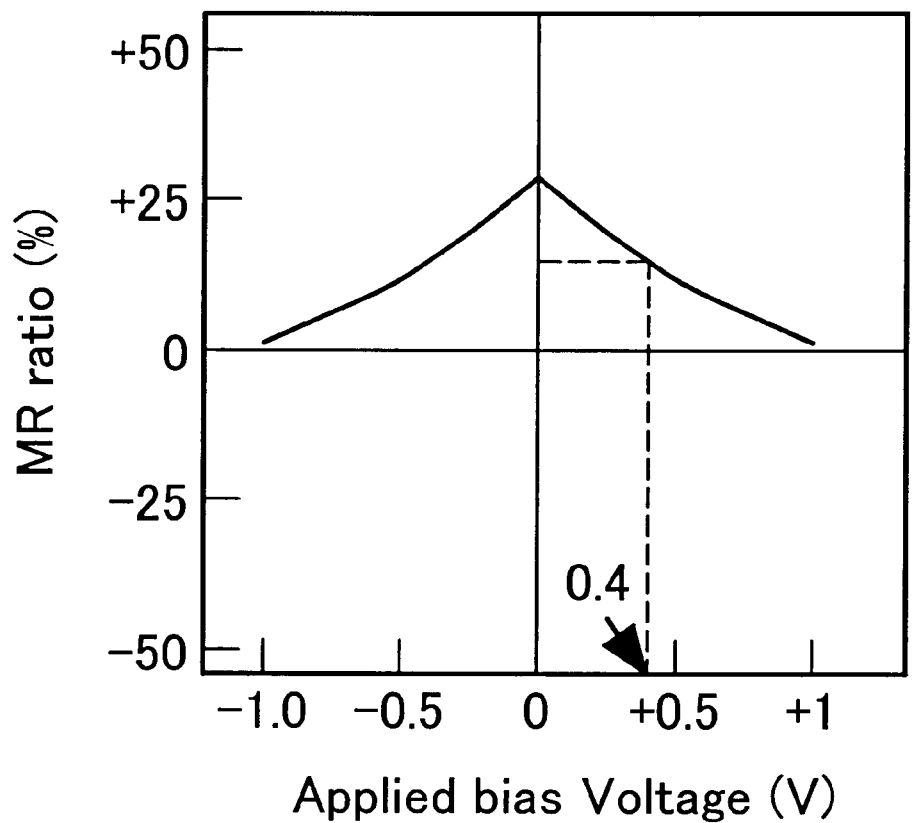
FIG. 11 is a diagram showing the dependence on bias voltage of the MR ratio of the conventional tunnel effect-type magnetic read head.

The curve (b) in FIG. 10 shows the dependence of the signal-to-noise ratio on the bias voltage in the case of the tunnel magnetoresistive magnetic head provided with the conventional tunnel magnetoresistive sensor which has the dependence of MR ratio on the bias voltage as shown in FIG. 11. It is noted that the S/N ratio reaches a maximum (approximately 25 dB) at Vs=−0.3 V and steeply decreases as the absolute value of Vs increases. The curve (a) in FIG. 10 shows the dependence of the signal-to-noise ratio on the bias voltage in the case of the tunnel magnetoresistive magnetic head provided with the conventional tunnel magnetoresistive sensor which has the dependence of MR ratio on the bias voltage as shown in FIG. 3A which is identical with that shown in FIG. 11 in which the maximum value of MR ratio is 30%. It is noted that the S/N ratio increases as the absolute value of Vs increases and reaches a maximum (34 dB) at Vs=−0.8 V.

The S/N ratio at Vs=−0.5 V (which is an operating voltage for a typical magnetic read head) is 9 dB greater in curve (a) than the S/N ratio shown by the curve (b) in FIG. 10. This occurs because the dependence of MR ratio on the bias voltage is at a maximum at Vs=−0.5 V, which is suitable to drive the magnetic read head. In the cases shown in FIGS. 2B, 3B, and 6, in which the maximum value of MR ratio is larger than that in FIG. 3A, the S/N ratio increases to a greater extent. As mentioned above, the tunnel magnetoresistive sensor of the present invention, which is improved in the dependence of MR ratio on the bias voltage, can be used to provide a tunnel magnetoresistive head having an extremely high sensitivity which is suitable for the magnetic recording apparatus for extremely high recording density (e.g., higher than 0.155 GB/mm$^2$ or 100 GB/inch$^2$)

Nothing in the above description is meant to limit the present invention to any specific materials, geometry, or orientation of elements. Many part/orientation substitutions are contemplated within the scope of the present invention and will be apparent to those skilled in the art. The embodiments described herein were presented by way of example only and should not be used to limit the scope of the invention.

Although the invention has been described in terms of particular embodiments in an application, one of ordinary skill in the art, in light of the teachings herein, can generate additional embodiments and modifications without departing from the spirit of, or exceeding the scope of, the claimed invention. Accordingly, it is understood that the drawings and the descriptions herein are proffered by way of example only to facilitate comprehension of the invention and should not be construed to limit the scope thereof.

What is claimed is:

1. A magnetic sensor, comprising:
   a soft magnetic layer;
   a ferromagnetic layer;
   a non-magnetic layer interposed between the soft magnetic layer and the ferromagnetic layer such that the magnetization of said ferromagnetic layer is fixed with respect to a magnetic field to be detected; and
   a magnetoresistive film which changes in magnetoresistance accordingly as the magnetization of said soft magnetic layer rotates in response to an external magnetic field, thereby changing the relative angle with the magnetization of said ferromagnetic layer,
   wherein the magnetoresistance of the magnetoresistive film changes upon application of a detecting current across said soft magnetic layer and said ferromagnetic layer through said non-magnetic layer, with a peak of the absolute value of the ratio of change in magnetoresistance of said magnetoresistive film being greater than 20% and occurring at a temperature in the range from 0° C. to 60° C. and with a bias voltage applied across said ferromagnetic layer and said soft magnetic layer being in ranges of +0.2 to +0.8 V and −0.8 to −0.2 V.

2. The magnetic sensor as defined in claim 1, wherein the ferromagnetic layer contains $Fe_3O_4$.

3. The magnetic sensor as defined in claim 2, wherein the non-magnetic layer is comprised of a material selected from the group consisting of at least one oxide of Sr, at least one oxide of Ti, at least one oxide of Ta, and a combination thereof.

4. The magnetic sensor as defined in claim 2, wherein the soft magnetic layer is comprised of a film of an alloy containing Co and Fe or a laminate film formed by sequentially depositing an alloy containing Co and Fe and an alloy containing Ni and Fe.

5. The magnetic sensor as defined in claim 1, wherein the ferromagnetic layer is comprised of a material selected from the group consisting of at least one oxide of Cr, at least one oxide of Mn, a compound containing Cr, a compound containing Mn, and a combination thereof.

6. The magnetic sensor as defined in claim 5, wherein the non-magnetic layer is comprised of a material selected from the group consisting of at least one oxide of Sr, at least one oxide of Ti, at least one oxide of Ta, and a combination thereof.

7. The magnetic sensor as defined in claim 5, wherein the soft magnetic layer is comprised of a film of an alloy containing Co and Fe or a laminate film formed by sequentially depositing an alloy containing Co and Fe and an alloy containing Ni and Fe.

8. The magnetic sensor as defined in claim 1, wherein the non-magnetic layer is comprised of a material selected from the group consisting of at least one oxide of Sr, at least one oxide of Ti, at least one oxide of Ta, and a combination thereof.

9. The magnetic sensor as defined in claim 1, wherein the soft magnetic layer is comprised of a film of an alloy containing Co and Fe or a laminate film formed by sequentially depositing an alloy containing Co and Fe and an alloy containing Ni and Fe.

10. A magnetic sensor according to claim 1, wherein said peak includes a maximum value.

11. A magnetic sensor, comprising:
    a half-metal magnetic layer;
    an alloy layer containing Co and Fe;
    a non-magnetic insulating layer comprised of at least one oxide of Sr, Ti, and Ta, which is interposed between the magnetic layer and the alloy layer such that the magnetization of said half-metal magnetic layer is fixed with respect to a magnetic field to be detected; and
    a magnetoresistive film which changes in magnetoresistance as the magnetization of said alloy layer rotates in response to an external magnetic field, thereby changing the relative angle with the magnetization of said half-metal magnetic layer,
    wherein the magnetoresistance of said magnetoresistive film changes upon application of a tunnel current across said half-metal magnetic layer and said alloy layer through said non-magnetic layer, with a peak of the absolute value of the ratio of change in magnetoresistance of said magnetoresistive film being greater than 20% and occurring at a temperature range of 0–60° C. and with a bias voltage applied across said ferromagnetic layer and said soft magnetic layer in ranges of −0.8 to −0.2 V and 0.2–0.8 V.

12. The magnetic sensor as defined in claim 11, wherein the half-metal magnetic layer comprises at least one material selected from the group consisting of $CrO_2$, $CrMnAl_2$, and $Fe_3O_4$.

13. A magnetic sensor according to claim 11, wherein said peak includes a maximum value.

14. A magnetic head, comprising:
  a magnetic sensor comprised of
    (a) a soft magnetic layer,
    (b) a ferromagnetic layer,
    (c) a non-magnetic layer interposed between the soft magnetic layer and the ferromagnetic layer such that the magnetization of said ferromagnetic layer is fixed with respect to a magnetic field to be detected, and
    (d) a magnetoresistive film which changes in magnetoresistance accordingly as the magnetization of said soft magnetic layer rotates in response to an external magnetic field, thereby changing the relative angle with the magnetization of said ferromagnetic layer, with a peak of the absolute value of the ratio of change in magnetoresistance of said magnetoresistive film being greater than 20% and occurring at a temperature range of 0–60° C. and with a bias voltage applied across said ferromagnetic layer and said soft magnetic layer in ranges of −0.8 to −0.2 V and 0.2–0.8 V;
  a pair of magnetic shields; and
  a metal layer interposed between said magnetic sensor and said magnetic shields to electrically connect said magnetic sensor to said magnetic shields.

15. The magnetic head as described in claim 14, wherein said sensor, said shields and said metal layer form a magnetic read head.

16. The magnetic head as described in claim 14, further comprising:
  a vertical magnetic recording head of single-magnetic pole type.

17. The magnetic head as described in claim 14, further comprising:
  an induction-type magnetic recording head.

18. A magnetic head according to claim 14, wherein said peak includes a maximum value.

19. A magnetic storage apparatus, comprising:
  a recording medium;
  a magnetic sensor comprised of
    (a) a soft magnetic layer,
    (b) a ferromagnetic layer,
    (c) a non-magnetic layer interposed between the soft magnetic layer and the ferromagnetic layer such that the magnetization of said ferromagnetic layer is fixed with respect to a magnetic field to be detected, and
    (d) a magnetoresistive film which changes in magnetoresistance accordingly as the magnetization of said soft magnetic layer rotates in response to an external magnetic field, thereby changing the relative angle with the magnetization of said ferromagnetic layer, with a peak of the absolute value of the ratio of change in magnetoresistance of said magnetoresistive film being greater than 20% and occurring at a temperature range of 0–60° C. and with a bias voltage applied across said ferromagnetic layer and said soft magnetic layer in ranges of −0.8 to −0.2 V and 0.2–0.8 V;
  a pair of magnetic shields; and
  a metal layer interposed between said magnetic sensor and said magnetic shields to electrically connect said magnetic sensor to said magnetic shields; wherein said sensor, said magnetic shields, and said metal layer form a magnetic read head used to read information stored on the recording medium.

20. The magnetic storage apparatus of claim 19, further including a magnetic recording head.

21. The magnetic storage apparatus of claim 19, wherein said soft magnetic layer, said ferromagnetic layer, and said non-magnetic layer are exposed on a surface adjacent to said recording medium.

22. A magnetic storage apparatus according to claim 19, wherein said peak includes a maximum value.

* * * * *